(12) United States Patent
Lee et al.

(10) Patent No.: US 8,936,983 B2
(45) Date of Patent: Jan. 20, 2015

(54) METHOD OF FABRICATING A SEMICONDUCTOR MEMORY DEVICE

(75) Inventors: Kang Jae Lee, Gyeongsangbuk-do (KR); Eun Joo Jung, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 499 days.

(21) Appl. No.: 13/325,312

(22) Filed: Dec. 14, 2011

(65) Prior Publication Data
US 2012/0156841 A1 Jun. 21, 2012

(30) Foreign Application Priority Data

Dec. 15, 2010 (KR) .......... 10-2010-0128296

(51) Int. Cl.
*H01L 21/336* (2006.01)
*H01L 27/115* (2006.01)

(52) U.S. Cl.
CPC .... *H01L 27/11534* (2013.01); *H01L 27/11529* (2013.01)
USPC ........... 438/257; 438/305; 438/587; 438/588; 257/E21.422; 257/E21.409

(58) Field of Classification Search
None
See application file for complete search history.

(56) References Cited

U.S. PATENT DOCUMENTS

| | | | | |
|---|---|---|---|---|
| 2002/0098704 A1* | 7/2002 | Chien et al. | .................... | 438/694 |
| 2007/0238053 A1* | 10/2007 | Hashimoto | .................... | 430/313 |
| 2008/0093648 A1* | 4/2008 | Oh et al. | ....................... | 257/315 |
| 2008/0121965 A1* | 5/2008 | Sato et al. | ..................... | 257/314 |
| 2008/0220600 A1* | 9/2008 | Alapati et al. | ................ | 438/584 |
| 2010/0176535 A1* | 7/2010 | Jacques | ......................... | 264/275 |
| 2011/0003469 A1* | 1/2011 | Kewley et al. | ................ | 438/591 |

FOREIGN PATENT DOCUMENTS

KR 1020050122294 A 12/2005
KR 1020090025425 A 3/2009

* cited by examiner

*Primary Examiner* — Angel Roman
(74) *Attorney, Agent, or Firm* — William Park & Associates Patent Ltd.

(57) ABSTRACT

A method of fabricating a semiconductor device according to present invention includes forming a stack layers on a semiconductor substrate having a first area and a second area; forming first gates on the semiconductor substrate of the first area by patterning the stack layers, wherein the first gates are formed a first distance apart from each other; forming a first impurity injection area in the semiconductor substrate of the first area exposed at both sides of each of the first gates; filling a space between the first gates with an insulating layer; forming second gates on the semiconductor substrate of the second area by patterning the stack layers, wherein the second gates are formed a second distance apart from each other, and wherein the second distance is larger than the first distance; and forming a second impurity injection area in the semiconductor device of the second area exposed between the second gates.

22 Claims, 10 Drawing Sheets

METHOD OF FABRICATING A SEMICONDUCTOR MEMORY DEVICE

CROSS-REFERENCE TO RELATED APPLICATIONS

This application claims priority from Korean Patent Application No. 10-2010-0128296, filed on Dec. 15, 2010, the contents of which are incorporated herein by reference in its entirety.

BACKGROUND OF THE INVENTION

The present invention relates generally to a method of fabricating a semiconductor memory device, more particularly relates to a method of fabricating a semiconductor memory device for preventing phenomenon that shape of gate patterns of a memory cell is deformed while an impurity injection area is formed.

A semiconductor memory device includes a plurality of impurity injection areas which are injected with impurities. The impurity injection area may be injected with impurities of different concentration or different kind in accordance with electrical characteristics which the impurity injection area would have. Also, the depth of impurity injection area may be adjusted. The impurity injection areas having different characteristics from each other are formed by performing repeatedly a process of forming an impurity injection mask for opening only the impurity injection areas having the same characteristics and covering the other impurity injection areas, a process of injecting corresponding impurities into only the opened impurity injection areas through open area of the impurity injection mask, a process of removing the impurity injection mask and a cleaning process.

With high integration of the semiconductor memory device, widths of gate patterns of memory cells decrease and a space between gate patterns of the memory cells becomes narrow. However, processes for forming the impurity injection areas, including the process of removing the impurity injection mask and the cleaning process, are generally performed after forming the gate patterns of the semiconductor memory device. Therefore, a leaning phenomenon or a bending phenomenon of the gate patterns may occur. Hereinafter, the leaning phenomenon or the bending phenomenon of the gate pattern of the memory cell in semiconductor memory device, e.g. NAND flash memory device due to the process of forming the impurity injection area will be described in detail.

The NAND flash memory device includes a cell area in which memory cells for storing data are formed, a select transistor area in which a drain select transistor or a source select transistor for selecting the memory cells is formed, and a peripheral area in which driving/controlling transistors for driving/controlling the NAND flash memory device are formed. The memory cells in a cell string of the NAND flash memory device are connected in series between the source select transistor and the drain select transistor. A first impurity injection area which is a cell junction area is formed at both sides of a gate of memory cell (hereinafter, referred to as "cell gate") in a semiconductor substrate of the cell area. A second impurity injection area which is a drain area or a source area is formed between gates of adjacent select transistors (hereinafter, referred to as "drain select gate") in the semiconductor substrate of the select transistor region. A third impurity injection area which is a source area or a drain area is formed at both sides of a gate of a driving/controlling transistor (hereinafter, referred to as "driving gate") in the semiconductor substrate of the peripheral area.

The first to the third impurity injection areas are formed after gate patterns including the cell gates, the source and the drain select gates and the driving gates are formed. The cell gate may have an aspect ratio higher than the source and the drain select transistors and the driving gate, and the space between the cell gates is narrower than the space between the source select gates, the space between the drain select gates and the space between the driving gates. Accordingly, the gate pattern is deformed mainly in the cell gate due to a process of forming the first to the third impurity injection areas.

Deformation of the cell gate may occur during the process of forming the second and the third impurity injection areas. The second and the third impurity injection areas may be formed with different concentration from the first impurity injection area or be formed by injecting impurities different from impurities in the first impurity injection area. Accordingly, to form the second impurity injection area or the third impurity injection area, the cell area is covered with an impurity injection mask for opening the peripheral area or the select transistor area, and then a process of injecting the impurities is performed. The impurity injection mask is removed through a strip process after the impurity injection process for forming the second impurity injection area or the third impurity injection area is performed, and a cleaning process is performed. Here, the cell gates which are formed with a narrow interval and a high aspect ratio may be deformed due to the process of removing the impurity injection mask for forming the second or the third impurity injection area and the cleaning process.

SUMMARY OF THE INVENTION

It is a feature of the present invention to provide a method of fabricating a semiconductor memory device for preventing a phenomenon that shape of gate patterns of a memory cell is deformed during a process of forming an impurity injection area.

A method of fabricating a semiconductor device according to an embodiment of the present invention includes forming a stack layers on a semiconductor substrate having a first area and a second area; forming first gates on the semiconductor substrate of the first area by patterning the stack layers, wherein the first gates are formed a first distance apart from each other; forming a first impurity injection area in the semiconductor substrate of the first area exposed at both sides of each of the first gates; filling a space between the first gates with an insulating layer; forming second gates on the semiconductor substrate of the second area by patterning the stack layers, wherein the second gates are formed a second distance apart from each other, and wherein the second distance is larger than the first distance; and forming a second impurity injection area in the semiconductor device of the second area exposed between the second gates.

A method of fabricating a semiconductor device according to an embodiment of the present invention includes
forming stack layers on a semiconductor substrate having a cell area, a select transistor area and a peripheral area; forming cell gates on the semiconductor substrate of the cell area by patterning the stack layers of the cell area; forming a first impurity injection area in the semiconductor substrate of the cell area exposed at both sides of the cell gate; filling a space between the cell gates with an insulating layer; forming select gates on the semiconductor substrate of the select transistor area and driving gates on the semiconductor substrate of the peripheral area by patterning the stack layers of the select transistor area and the peripheral area; forming a second impurity injection area in the semiconductor substrate of the select transistor area exposed between the select gates; and forming a third impurity injection area in the semiconductor substrate of the peripheral area exposed at both sides of the driving gate.

A method of fabricating a semiconductor device according to an embodiment of the present invention includes forming stack layers on a semiconductor substrate having a cell area, a select transistor area and a peripheral area; forming cell gates and select gates by patterning the stack layers of the cell area and the select transistor area, wherein a distance between the select gates is larger than a distance between the cell gates, and wherein the cell gates are formed on the semiconductor substrate of the cell area and the select gates are formed on the semiconductor substrate of the select transistor area; forming a first impurity injection area in the semiconductor substrate of the cell area exposed at both sides of respective cell gates and in the semiconductor substrate of the select transistor area exposed between the select gates; forming a spacer layer along an entire structure including the first impurity injection to fill a space between the cell gates with the spacer layer and to expose a center portion of a space between the select gates; forming a second impurity injection area in the semiconductor substrate of the select transistor area between the select gates; forming driving gates on the semiconductor substrate of the peripheral area by patterning the stack layers; and forming a third impurity injection area in the semiconductor substrate of the peripheral area exposed at both sides of the driving gate.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF SPECIFIC EMBODIMENTS

Hereinafter, the preferred embodiments of the present invention will be explained in more detail with reference to the accompanying drawings. Although embodiments have been described with reference to a number of illustrative embodiments thereof, it should be understood that numerous other modifications and embodiments can be devised by those skilled in the art that will fall within the spirit and scope of the principles of this disclosure.

FIG. 1A to FIG. 1M are sectional views illustrating a NAND flash memory device for describing a method of fabricating a semiconductor device according to an embodiment of the present invention. FIG. 1A to FIG. 1M show mainly an active area.

Figure 1A:
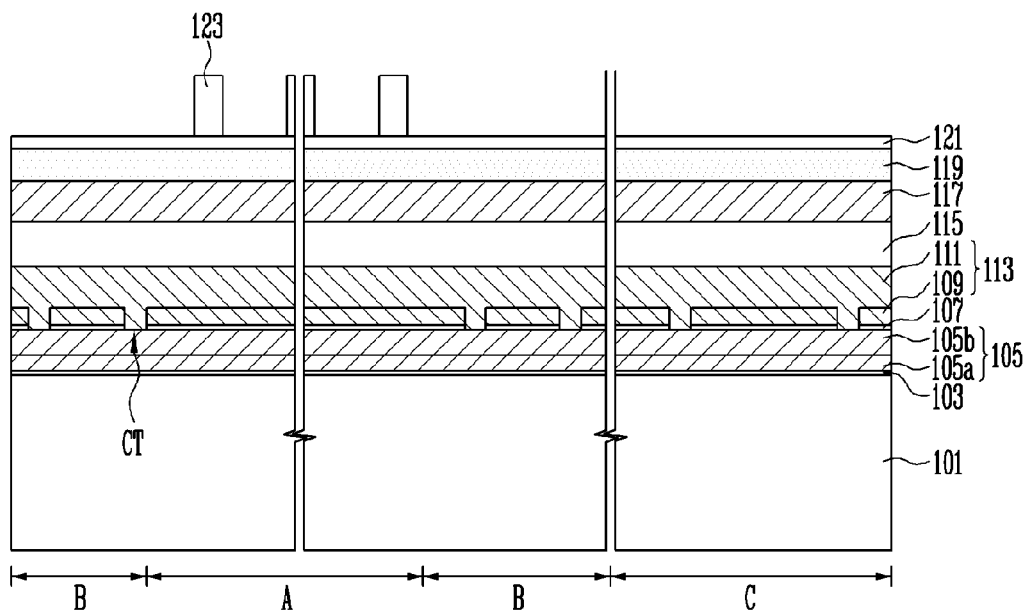
FIG. 1A to FIG. 1M are sectional views illustrating a NAND flash memory device for describing a method of fabricating a semiconductor device according to an embodiment of the present invention.

In FIG. 1A, stack layers 103, 105, 107 and 113 are formed on a semiconductor substrate 101 having a cell area (hereinafter, referred to as "first area", A), a select transistor area (hereinafter, referred to as "second area", B) and a peripheral area (hereinafter, referred to as "third area", C).

The first area A corresponds to an area in which memory cells for storing data are formed, the second area B corresponds to an area in which select transistors (a source select transistor and a drain select transistor) for selecting the memory cells are formed, and the third area C corresponds to an area in which driving transistors for driving or controlling a memory device are formed.

The stack layers may include a gate insulating layer 103, a floating gate layer 105, a dielectric layer 107 and a control gate layer 113. In the stack layers of the second area B or the third area C, dielectric layer may have contact holes CT for coupling the control gate layer 113 to the floating gate layer 105.

The active area of the semiconductor substrate 101 is an area separated by an isolation layer, and the isolation layer is formed by filling an isolation trench formed by etching the isolation area of the semiconductor substrate 101 with insulating material. The gate insulating layer 103 and the floating gate layer 105 may be removed from the isolation area of the semiconductor substrate 101 during a process of forming the isolation layer. A method of removing the gate insulating layer 103 and the floating gate layer 105 from the isolation area using the process of forming the isolation layer will be described in detail.

The gate insulating layer 103 is formed on the semiconductor substrate 101, the floating gate layer 105 is formed on the gate insulating layer 103, and then isolation hard mask patterns (not shown) are formed on the floating gate layer 105. Subsequently, exposed area of the floating gate layer 105 is removed by using the isolation hard mask patterns as an etching mask, and then exposed area of the gate insulating layer 103 is removed. Trenches are formed by etching the exposed area of the semiconductor substrate 101 in certain depth, and the isolation layer is formed by filling the trenches with the insulating material. Here, the height of the formed insulating material may be controlled to target height through an etching process after the trenches is filled. Accordingly, the gate insulating layer 103 and the floating gate layer 105 remain on the active areas corresponding to the first, second and third areas A, B and C of the semiconductor substrate 101, and are removed from the isolation area.

The gate insulating layer 103 may be a silicon oxide layer, and the floating gate layer 105 may be formed by stacking an undoped poly silicon layer 105a and a doped poly silicon layer 105b.

The dielectric layer 107 including the contact holes CT is formed on the floating gate layer 105, remaining on the active area, and the isolation layer. The contact holes CT is formed to expose the floating gate layer 105 so that the control gate layer 113 to be formed is connected electrically to the floating gate layer 105 in the second area B and the third area C, and may be formed by using a photolithography process. The dielectric layer 107 may be formed by stacking an oxide layer, a nitride layer and an oxide layer.

The control gate layer 113 may include a capping poly silicon layer 109 formed on the dielectric layer 107 and a conducting layer 111 formed on the capping poly silicon layer 109. Here, the capping poly silicon layer 109 is formed so as to minimize damage of the dielectric layer 107 during the process of forming the contact holes CT. The conducting layer 111 may be formed of one or more of a poly silicon layer, a metal layer and a metal silicide layer.

A first hard mask layer 115 is formed on the stack layers 103, 105, 107 and 113. The first hard mask layer 115 is used as an etching mask during an etching process of patterning the stack layers 103, 105, 107 and 113. The first hard mask layer 115 may be patterned by using a spacer patterning technology to form gate patterns to be formed in the cell area A in smaller pattern widths and/or intervals than an exposure resolution limitation. Hereinafter, a process of patterning the first hard mask layer 115 using the spacer patterning technology will be described.

A second hard mask layer 117 and an auxiliary layer 119 are formed on the first hard mask layer 115 to apply the spacer patterning technology. Subsequently, a protection layer 121 may be formed further on the auxiliary layer 119 according to material of the auxiliary layer 119.

The second hard mask layer 117 is used as an etching mask during an etching process of patterning the first hard mask layer 115, and is formed of material different from the first hard mask layer 115 to minimize damage of the first hard mask layer 115 during following etching process of forming a spacer on the second hard mask layer 117. For example, the first hard mask layer 115 may be formed of a tetra ethyl ortho silicate TEOS oxide, and the second hard mask layer 117 may be formed of a poly silicon.

The auxiliary layer 119 may be formed of material different from the spacer, e.g. the auxiliary layer 119 may be formed of a spin on carbon SOC. The protection layer 121 is formed to prevent exposure of the auxiliary layer 119 in case that a possibility that the auxiliary layer 119 is removed during a process of removing first etching mask patterns 123 exits. Also, the protection layer 121 may be formed of a SiON layer.

Then, the first etching mask patterns 123 are formed on the auxiliary layer 119 corresponding to the first area A. The first etching mask patterns 123 may be formed of photoresist material, and be formed by using the photolithography process. Accordingly, the first etching mask patterns 123 may be formed in pattern widths and/or intervals limited by the exposure resolution limitation.

Figure 1B:
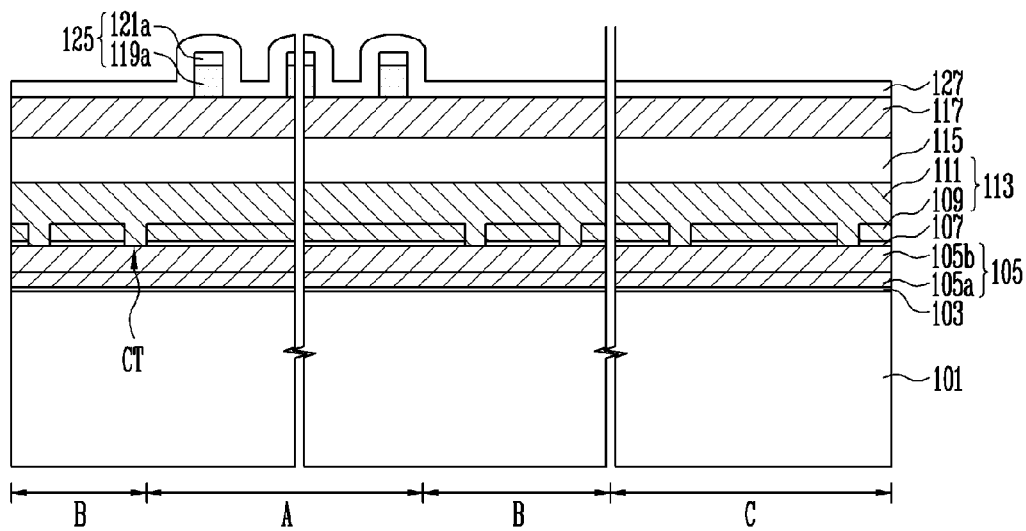

In FIG. 1B, protection layer patterns 121a are formed by removing a part exposed through the first etching mask patterns 123 of the protection layer 121, and auxiliary layer patterns 119a are formed by removing a part exposed through the protection layer patterns 121a of the auxiliary layer 119. As a result, partition patterns 125 in which the auxiliary layer pattern 119a and the protection layer pattern 121a are stacked are formed on the second hard mask layer 117 corresponding to the first area A.

Subsequently, the first etching mask patterns 123 are removed, and a spacer layer 127 is formed along surfaces of the partition patterns 125 and an exposed surface of the second hard mask layer 117. The spacer layer 127 may be formed of an oxide.

Figure 1C:
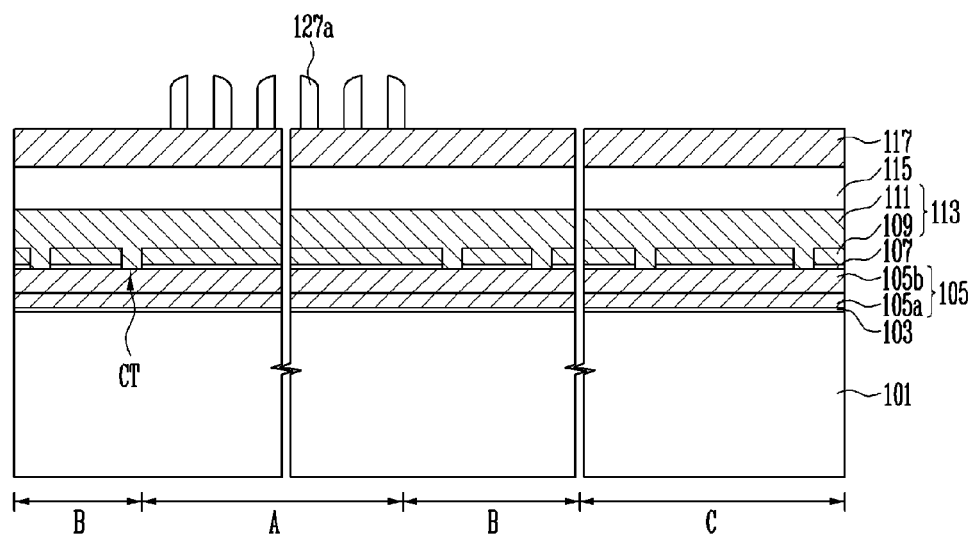
Figure 1D:
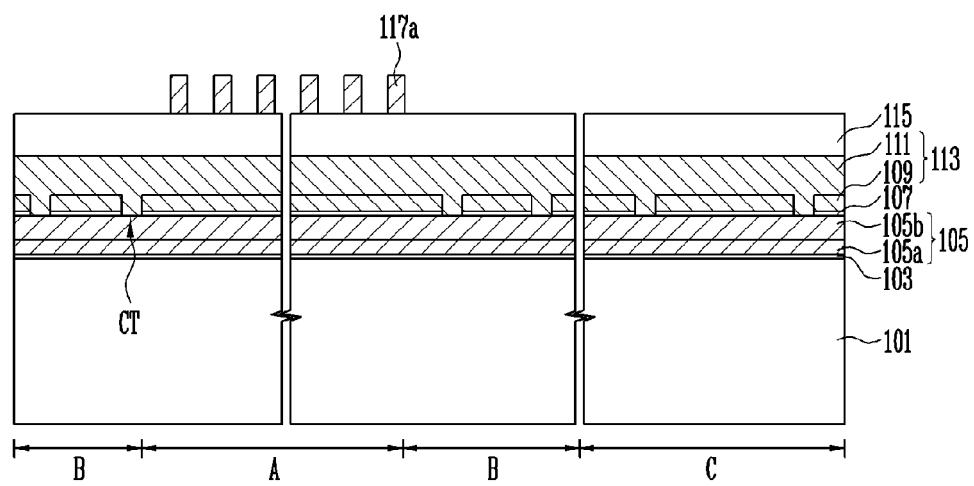

The spacer layer 127 is etched through an etching process such as an etch back, etc. so that the partition patterns 125 are exposed, and thus spacers 127a remain on sidewalls of each of the partition patterns 125. Then, the partition patterns 125 are removed as shown in FIG. 1C. Since a distance between the spacers 127a is determined according to deposition thickness of the spacer layer 127, patterns may be formed in the smaller pattern widths and/or intervals than the exposure resolution limitation. Second hard mask patterns 117a for defining an area in which gates of a cell are formed in the first area A are formed by removing the second hard mask layer 117 exposed through the spacers 127a as shown in FIG. 1D.

Figure 1E:
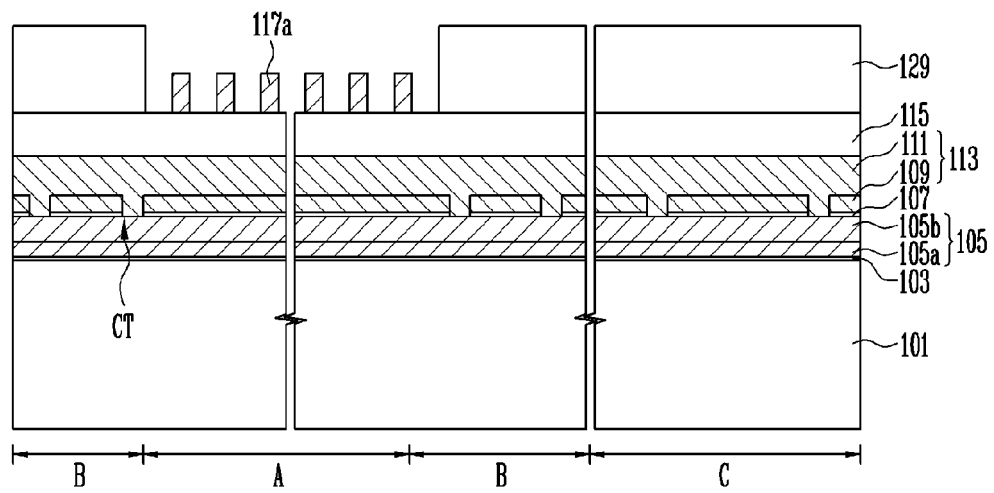

In FIG. 1E, second etching mask patterns 129 for preventing the first hard mask layer 115 are formed in the second area B and the third area C. The second etching mask patterns 129 may be formed by using a photolithography process, and be formed of photoresist material. The first hard mask layer 115 and the second hard mask patterns 117a in the first area A expose through the second etching mask patterns 129.

Figure 1F:
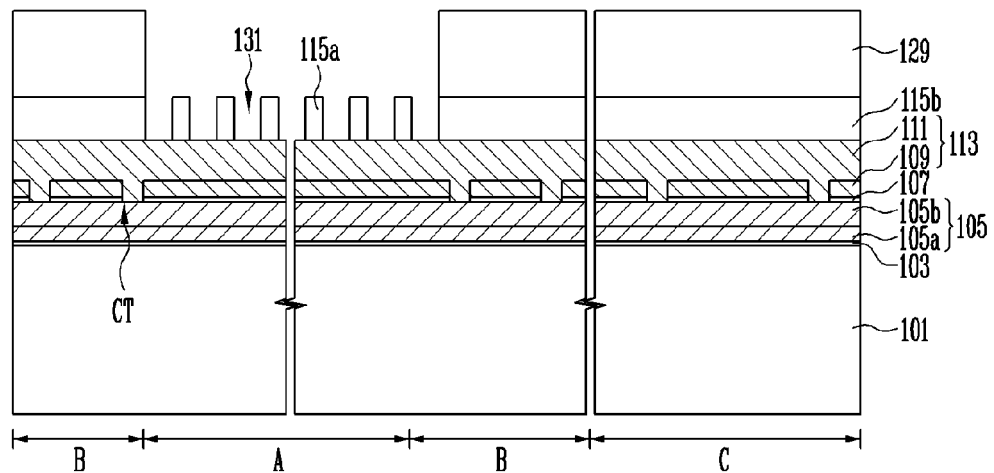

First hard mask patterns 115a and 115b are formed by removing the first hard mask layer 115 in the first area A exposing through the second etching mask patterns 129 and the second hard mask patterns 117a as shown in FIG. 1F. Subsequently, the second hard mask patterns 117a and the second etching mask patterns 129 are removed.

In FIG. 1F, the first hard mask patterns 115a and the trenches 131 are formed in the first area A. Here, the trenches 131 expose the stack layers 103, 105, 107 and 113 between the first hard mask patterns 115a, and the first hard mask patterns 115a define the area in which the gates of the cell are formed. Whereas, the first hard mask patterns 115b in the second area B and the third area C cover the stack layers 103, 105, 107 and 113.

FIG. 1A to FIG. 1F show an exemplary process of applying the spacer patterning technology to form the width of the first hard mask pattern 115a in the first area A to be smaller than the exposure resolution limitation. However, the present invention is not limited as the above example, and the first hard mask patterns 115a and 115b shown in FIG. 1F may be formed by performing a photolithography process and a process of etching the first hard mask layer after forming the first hard mask layer.

Figure 1G:
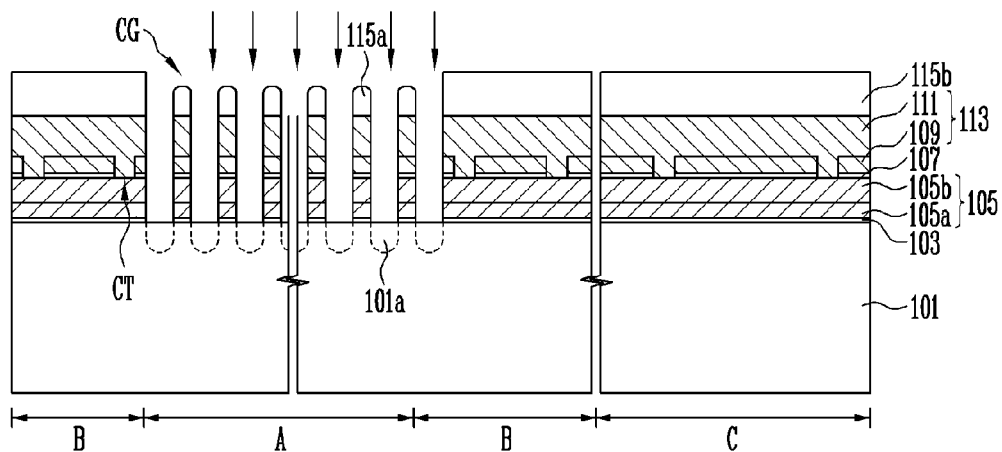

Cell gates CG are formed on the semiconductor substrate 101 of the first area A by etching the stack layers 103, 105, 107 and 113 using the remaining first hard mask patterns 115a and 115b as an etching mask as shown in FIG. 1G after forming the first hard mask patterns 115a and 115b. In this case, the stack layers 103, 105, 107 and 113 on the semiconductor substrate 101 of the second and the third areas B and C are not patterned because they are covered by the first hard mask patterns 115b.

Next, a first impurity injection area 101a is formed by injecting impurities into the semiconductor substrate 101 of the first area A exposed at both sides of the cell gates CG. The first impurity injection area 101a may be formed through a counter doping process and a process of injecting impurities for forming a junction area of the cell. The impurities for the first impurity injection area 101a may be phosphorus P or arsenic As, but different impurities may be injected.

Since the second area B and the third area C are covered by the stack layers 103, 105, 107 and 113 during the process of forming the first impurity injection area 101a, the first impurity injection area 101a is not formed in the second area B and the third area C even without extra impurity injection mask. Accordingly, a process of removing the impurity injection mask after forming the first impurity area 101a and a cleaning process may be omitted, and thus a phenomenon that the cell gates CG falls down or are bent is minimized.

Figure 1H:
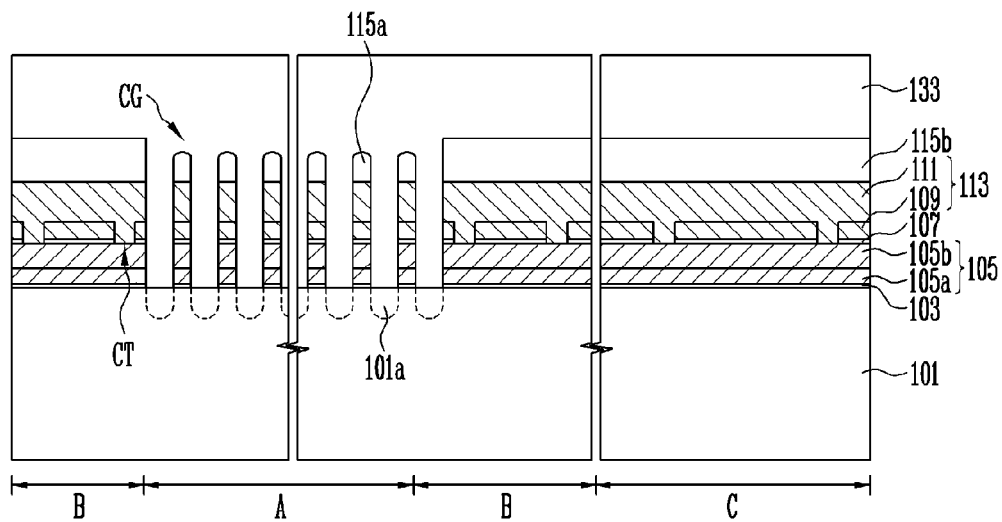
Figure 1I:
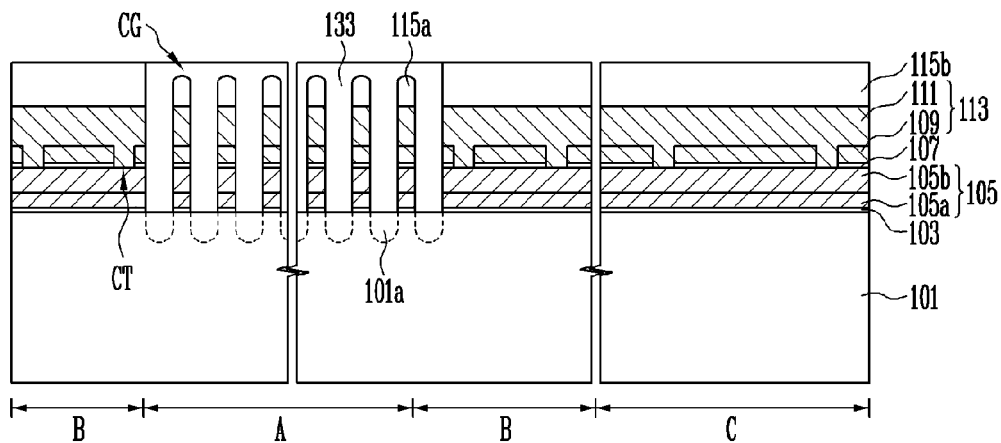
Figure 1J:
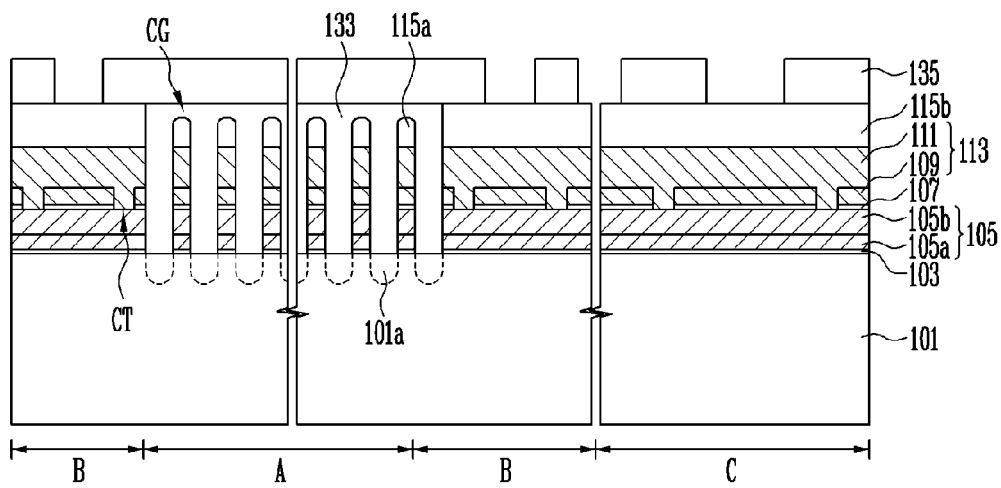

In FIG. 1H, a first insulating layer 133 is formed over whole area of the semiconductor substrate 101 in which the first impurity injection area 101a is formed, so as to fill a space between the cell gates CG. The first insulating layer 133 may be an oxide layer. Subsequently, a planarization process of the first insulating layer 133 is performed so that the first hard mask pattern 115b is exposes as shown in FIG. 1I. The planarization process of the first insulating layer 133 may be performed through a process such as a chemical mechanical polishing CMP, etc.

In FIG. 13, third etching mask patterns 135 are formed over the first hard mask pattern 115b in the second area B and the third area C. The third etching mask patterns 135 define an area in which select gates and driving gates are formed, and cover the first insulating layer 133 and the gates CG in the first area A. The third etching mask patterns 135 may be formed by using a photolithography process, and be formed of photoresist material.

Figure 1K:
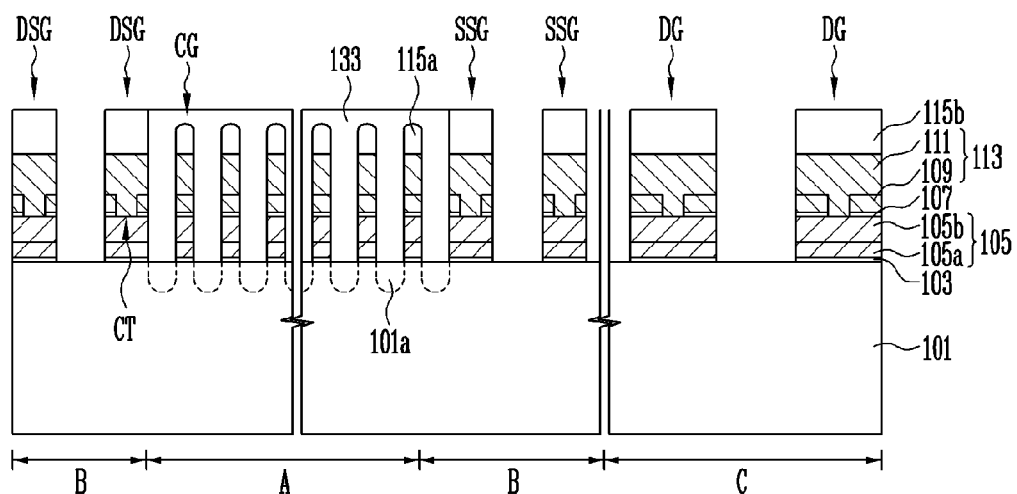

A part of the first hard mask pattern 115b exposed through the third etching mask patterns 135 is removed as shown in FIG. 1K. A part of the stack layers 103, 105, 107 and 113 exposed through the area in which the first hard mask pattern 115b is removed is etched, and thus select gates DSG and SSG are formed on the semiconductor substrate 101 of the second area B and driving gates DG are formed on the semiconductor substrate 101 of the third area C. Then, the third etching mask patterns 135 may be removed.

The select gates includes a drain select gate DSG and a source select gate SSG, and the cell gates CG included in a cell string are arranged between the drain select gate DSG and the source select gate SSG. The drain select gates DSG or the source select gates SSG may be formed at boundary of adjoining cell strings. The driving gates DG corresponds to, for example, gates of a driver for driving a memory device. Space between the select gates DSG and SSG and space between the driving gates DG may be wider than that between the cell gates CG. The select gate DSG or SSG and the driving gate DG may have an aspect ratio smaller than the cell gate CG.

Figure 1L:
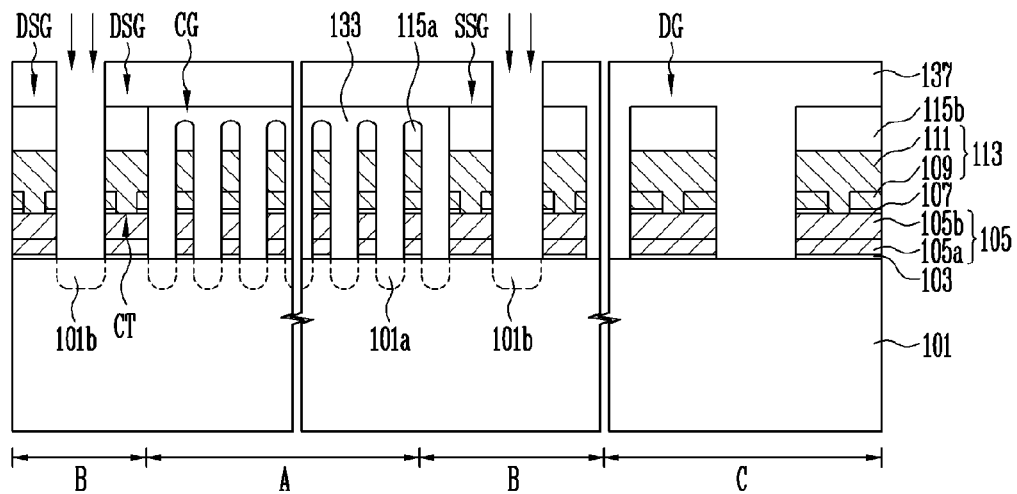

In FIG. 1L, an impurity injection mask 137 for covering the third area C and exposing the semiconductor substrate 101 between the select gates DSG and SSG is formed. The impurity injection mask 137 may be formed of photoresist material, and be formed through a photolithography process. In an embodiment of the present invention, the impurity injection mask 137 may cover the first area A.

Then, a second impurity injection area 101b is formed by injecting impurities into the semiconductor substrate 101 between the select gates DSG and SSG exposed through the impurity injection mask 137. The second impurity injection area 101b may be formed through a counter doping process and an impurity injection process for forming a drain junction area (e.g., second impurity injection area 101b between the drain select gates DSG) and a source junction area (e.g., second impurity injection area 101b between the source select gates SSG). The impurities for the second impurity injection area 101b may be phosphorus P or arsenic As, but different impurities may be injected. In addition, a contact plug may be connected to the second impurity injection area 101b in following process. Accordingly, concentration of the impurities injected into the second impurity injection area 101b may be higher than that of the impurities injected into the first impurity injection area 101a to reduce contact resistance between the contact plug and the second impurity injection area 101b.

Figure 1M:
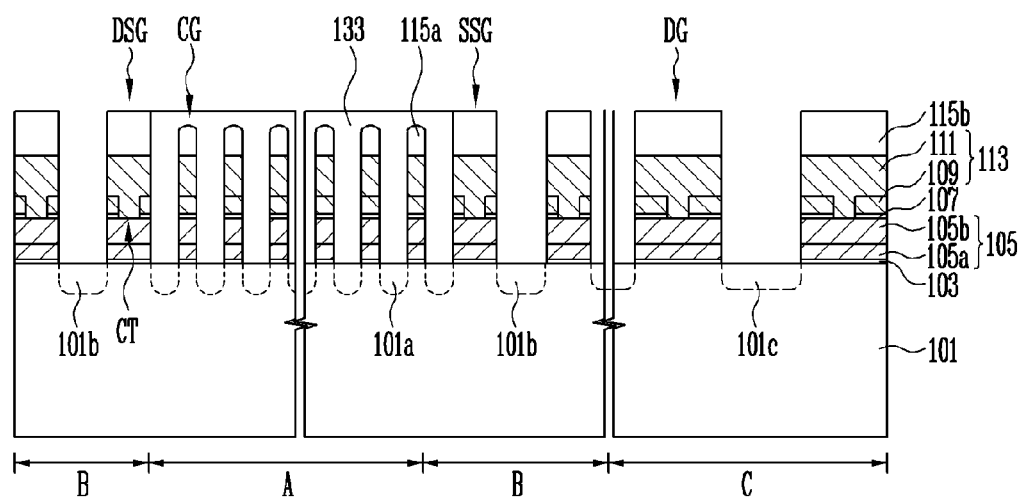

In FIG. 1M, the impurity injection mask 137 is removed through a strip process after the second impurity injection area 101b is formed, and a cleaning process is performed. Since the first insulating layer 133 is formed between the cell gates CG through precedent process when the process of removing the impurity injection mask 137 and the cleaning process are performed, shape of the cell gate CG may not be deformed due to the first insulating layer 133 but be maintained though the aspect ratio of the cell gate CG is high and the space between the cell gates CG is narrow.

Subsequently, a third impurity injection area 101c is formed in the semiconductor substrate 101 at both sides of the driving gates DG. The third impurity injection area 101c may be formed by using an impurity injection mask like the process of forming the second impurity injection area 101b. Here, the impurity injection mask for forming the third impurity injection area 101c covers the semiconductor substrate 101 of the first area A and the second area B, and exposes the semiconductor substrate 101 of the third area C at both sides of the driving gates DG. Additionally, the third impurity injection area 101c is formed by using a counter doping process and an impurity injection process for forming a source area and a drain area of the driver. Then, the impurity injection mask for forming the third impurity injection area 101c is removed, and a cleaning process is performed. Here, a space between the cell gates CG is filled with the first insulating layer 133 through precedent process, shape of the cell gate CG may not be deformed due to the first insulating layer 133 but be maintained though the aspect ratio of the cell gate CG is high and the space between the cell gates CG is narrow. Subsequently, following process such as a process of forming a second insulating layer between the select gates DSG and SSG and the driving gates DG, etc. may be performed, which is not shown.

The second and the third impurity injection areas 101b and 101c are separately formed through respective process in the above description, but the impurity injection areas 101b and 101c may be formed simultaneously through the same process.

In an embodiment of the present invention, the process of forming the impurity injection mask for forming the impurity areas 101b and 101c in the second and the third areas B and C under the condition that a space between the cell gates CG is filled with the first insulating layer 133, the process of removing the impurity injection mask and following cleaning process are performed. Accordingly, the shape of the cell gate CG may not be deformed due to the first insulating layer 133 during the process of removing the impurity injection mask and the following cleaning process.

In an embodiment, the driving gates DG are patterned separately from the cell gates CG, and thus damage of the semiconductor substrate 101 occurred due to difference of etching speed, when patterns having large widths and/or intervals and patterns having small widths and/or intervals are simultaneously patterned, may be improved. Here, the distance between the driving gates DG is wider than that between the cell gates CG. The etching speed of an area in which patterns having large widths and/or intervals is generally faster than that of an area in which patterns having small widths and/or intervals, and thus the semiconductor substrate 101 may be damaged at the area in which the patterns having large widths and/or intervals.

In an embodiment, since the second and the third impurity areas 101b and 101c are formed separately from the first impurity area 101a, a process of tuning electrical conditions of the impurity areas using extra impurity injection process to satisfy electrical characteristics required for respective impurity areas may be omitted.

FIG. 2A to FIG. 2G are sectional views illustrating a NAND flash memory device for describing a method of fabricating a semiconductor device according to an embodiment of the present invention. FIG. 2A to FIG. 2G show mainly an active area.

Figure 2A:
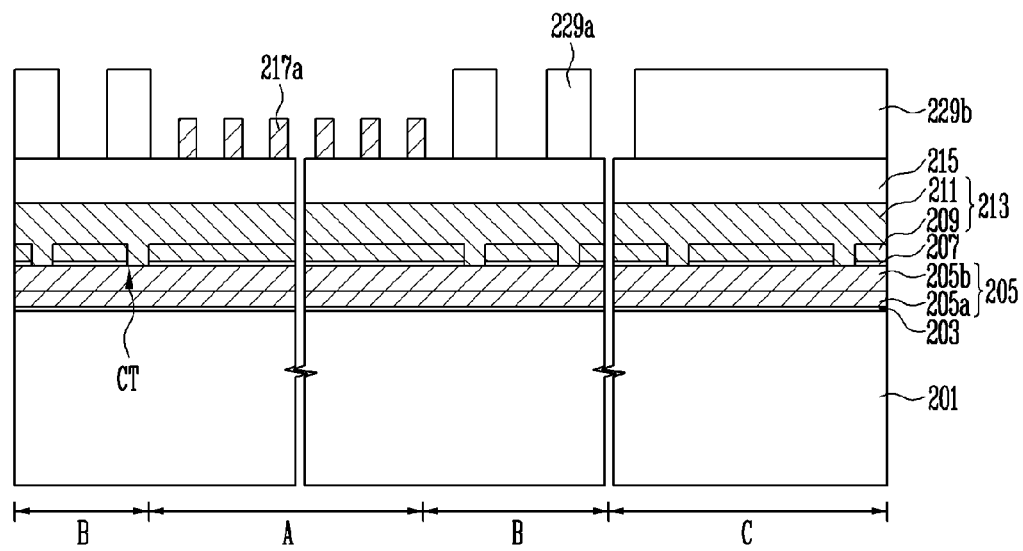
FIG. 2A to FIG. 2G are sectional views illustrating a NAND flash memory device for describing a method of fabricating a semiconductor device according to an embodiment of the present invention.

In FIG. 2A, stack layers 203, 205, 207 and 213 are formed on a semiconductor substrate 201 having a cell area (hereinafter, referred to as "first area", A), a select transistor area (hereinafter, referred to as "second area", B) and a peripheral area (hereinafter, referred to as "third area", C). Subsequently, a first hard mask layer 215 is formed on the stack layers 203, 205, 207 and 213 for the gate pattern like in FIG. 1A.

The stack layers include a gate insulating layer 203 and a floating gate layer 205 formed by stacking undoped poly silicon layer 205a and a doped poly silicon layer 205b, a dielectric layer 207 having contact holes CT, and a control gate layer 213 formed by stacking a capping poly silicon layer 209 and a conducting layer 211. Materials of the stacking layers may be identical to those in FIG. 1A.

Second hard mask patterns 217a are formed on the first hard mask layer 215. In an embodiment of the present invention, the second hard mask patterns 217a are formed only in the first area A. The second hard mask patterns 217a may be formed by using a spacer patterning technology to form a width of cell gate formed in the first area A to be smaller than in exposure resolution limitation. A second hard mask layer is formed on the first hard mask layer 215 to form the second hard mask patterns 217a as described in FIG. 1A, material of the second hard mask layer being different from that of the first hard mask layer 215. An auxiliary layer is formed on the second hard mask layer, and then a protection layer is formed or not formed on the auxiliary layer according to material of the auxiliary layer. Materials of the first hard mask layer 215, the second hard mask layer, the auxiliary layer and the protection layer may be the same as those in FIG. 1A. Subsequently, first etching mask patterns are formed on the auxiliary layer in the first area A as described in FIG. 1A. The first etching mask patterns may be formed of photoresist material, and be formed by using a photolithography process. Accordingly, the first etching mask patterns are formed in pattern widths and/or intervals limited by the exposure resolution limitation. Then, partition patterns are formed on the second hard mask layer corresponding to the first area A by removing the protection layer and the auxiliary layer exposed between the first etching mask patterns as described in FIG. 1B. Subsequently, the first etching mask patterns are removed as described in FIG. 1B, spacers are formed on sidewalls of respective partition patterns, the partition patterns are removed, and then second hard mask patterns 217a defining an area in which cell gates are formed are formed in the first area A by removing the second hard mask layer exposed through the spacers as shown in FIG. 2A.

Second etching mask patterns 229a and 229b are formed on the first hard mask layer 215 corresponding to the second and the third areas B and C after the second hard mask patterns 217a are formed. The second etching mask patterns 229a and 229b may be formed by using a photolithography process, and be formed of photoresist material.

The second etching mask patterns 229a in the second area B are formed with distance wider than the second hard mask patterns 217a, expose a part of the first hard mask layer 215 in the second area B, and defines an area in which select gates are formed. The second etching mask patterns 229b may be formed in whole of the third area C so that the first hard mask layer 215 in the third area C is not exposed. The first hard mask layer 215 and the second hard mask patterns 217a are exposed between the second etching mask patterns 229a and 229b in the first and the second areas A and B.

Figure 2B:
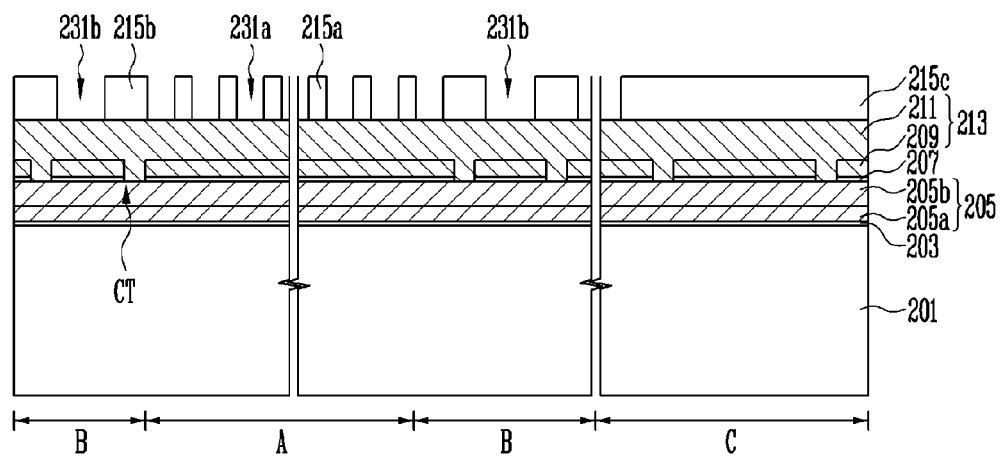

First hard mask patterns 215a, 215b and 215c are formed by removing the first hard mask layer 215 in the first and the second area A and B exposed through the second etching mask patterns 229a and 229b and the second hard mask patterns 217a as shown in FIG. 2B. Next, the second hard mask patterns 217a and the second etching mask patterns 229a and 229b are removed.

In FIG. 2B, the first hard mask patterns 215a in the first area A are formed apart from each other by a trench of a first width. Here, the first hard mask patterns 215a in the first area A define the area in which the cell gates are formed and the trench 213a is formed between the first hard mask patterns 215a to expose the stack layers 203, 205, 207 and 213. The first hard mask patterns 215b in the second area B are formed apart from each other by a trench of a second width. Here, the first hard mask patterns 215b in the second area B define an area in which select gates are formed, and the trench 213b is formed between the first hard mask patterns 215b to expose the stack layers 203, 205, 207 and 213. According to an example, the second width is larger than the first width. Whereas, first hard mask patterns 215c in the third area C cover the stack layers 203, 205, 207 and 213 in the third area C.

FIG. 2A and FIG. 2B show an exemplary process of applying the spacer patterning technology to form the width of the first hard mask pattern 215a in the first area A to be smaller than in the exposure resolution limitation. However, the present invention is not limited as the above example, and the first hard mask patterns 215a, 215b and 215c shown in FIG. 2B may be formed by performing a photolithography process and a process of etching the first hard mask layer after forming the first hard mask layer.

Figure 2C:
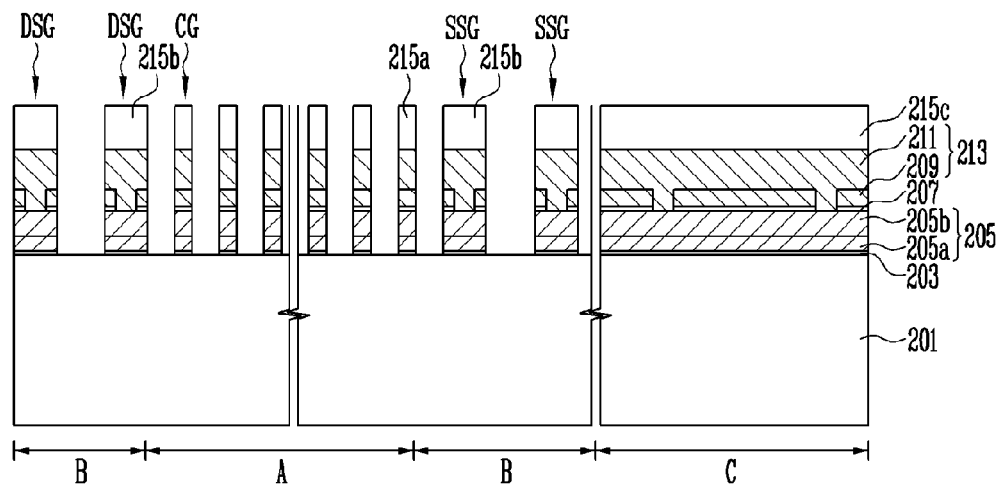

The stack layers 203, 205, 207 and 213 are etched by using the first hard mask patterns 215a, 215b and 215c as an etching mask as shown in FIG. 2C after the first hard mask patterns 215a, 215b and 215c are formed, and thus cell gates CG are formed on the semiconductor substrate 201 of the first area A and select gates DSG and SSG are formed on the semiconductor substrate 201 of the second area B. The select gates includes a drain select gate DSG and a source select gate SSG, and the cell gates CG formed between the drain select gate DSG and the source select gate SSG. The drain select gates DSG or the source select gates SSG may be formed at boundary of adjoining cell strings.

Spaces between the select gates DSG and SSG are wider than those between the cell gates CG. The select gate DSG or SSG may have an aspect ratio smaller than the cell gate CG.

Since the stack layers 203, 205, 207 and 213 in the third area C are covered by the first hard mask patterns 215c when the cell gats CG and the select gates DSG and SSG are patterned, the stack layers 203, 205, 207 and 213 in the third area C are not patterned.

Figure 2D:
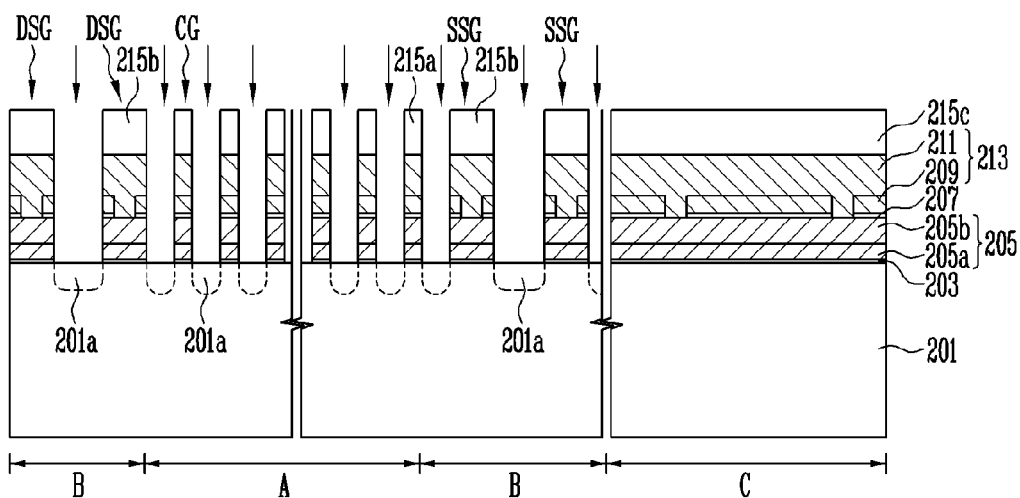

In FIG. 2D, the cell gates CG and the select gates DSG and SSG are formed, and then a first impurity injection area 201a is formed by injecting impurities into the semiconductor substrate 201 of the first area A exposed at both sides of the cell gates CG and the semiconductor substrate 201 of the second area B exposed between the select gates DSG and SSG. The first impurity injection area 201a may be formed through a counter doping process and a process of injecting impurities for forming a junction area of the cell. The impurities for the first impurity injection area 201a may be phosphorus P or arsenic As, but different impurities may be injected.

Since the third area C are covered by the stack layers 203, 205, 207 and 213 during the process of forming the first impurity injection area 201a, the first impurity injection area 201 is not formed in the third area C even without extra impurity injection mask. Accordingly, a process of removing the impurity injection mask after forming the first impurity injection area 201a and a cleaning process may be omitted, and thus a phenomenon that the cell gates CG falls down or are bent is minimized. The first impurity injection area 201a in the second area B may be used as a lightly doped drain LDD area of a source area or a drain area formed between the select gates DSG and SSG.

Figure 2E:
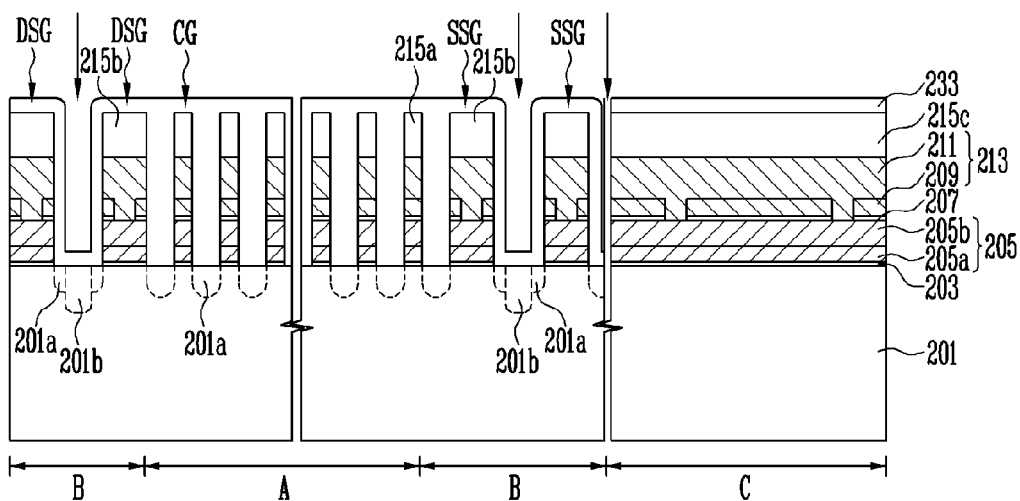

In FIG. 2E, a spacer layer 233 is formed along whole surface of the semiconductor substrate 201 in which the first impurity injection area 201a is formed. According to an example, the spacer layer 233 is an insulating layer such as an oxide layer. Spaces between the cell gates CG having relatively narrow intervals are filled with the spacer layer 233, and the spacer layer 233 may have "U" shape between the select gates DSG and SSG having relatively wide intervals.

A second impurity injection area 201b is formed by injecting impurities into the semiconductor substrate 201 between the select gates DSG and SSG. The second impurity injection area 201b may be formed through a counter doping process and an impurity injection process for forming a drain junction area (second impurity injection area 201b between the drain select gates DSG) of the cell string and a source junction area (second impurity injection area 201b between the source select gates SSG). The impurities for the second impurity injection area 201b may be phosphorus P or arsenic As, but different impurities may be injected. In addition, a contact plug may be connected to the second impurity injection area 201b in following process. Accordingly, concentration of the impurities injected into the second impurity injection area 201b may be higher than that of the impurities injected into the first impurity injection area 201a to reduce contact resistance between the contact plug and the second impurity injection area 201b.

Thickness of a part of the spacer layer 233 formed on the semiconductor substrate 201 between the cell gates CG is greater than that of a part of the spacer layer 233 formed on the semiconductor substrate 201 between the select gates DSG and SSG when the second impurity injection area 201b is formed. Accordingly, energy for injecting impurities may be controlled so that the spacer layer 233 having relatively large thickness functions as an impurity injection mask when the second impurity injection area 201b is formed. That is, the impurities are not injected into the semiconductor substrate 201 between the cell gates CG due to the spacer layer 233 having relatively large thickness, and thus the second impurity injection area 201b may not be formed. Also, the impurities may be injected into the semiconductor substrate 201 corresponding to the spacer layer 233 having relatively small thickness.

In an embodiment of the present invention, the first impurity injection area 201a having concentration lower than the second impurity injection area 201b may remain at both sides of the second impurity injection area 201b and be a lightly doped drain (LDD) area. Furthermore, since the impurities are injected under the condition that the semiconductor substrate 201 is protected by the spacer layer 233, the spacer layer 233 may function as a buffer layer. As a result, a probability that the semiconductor substrate 201 is damaged by the process of injecting the impurities may decrease.

Since the third area C is covered by the stack layers 203, 205, 207 and 213 during the process of forming the second impurity injection area, the second impurity injection area 201b is not formed in the third area C though extra impurity injection mask is not formed.

As described above, although extra impurity injection mask is not formed in the process of forming the second impurity injection area 201b, the first area A is covered by the spacer layer 233 and the third area C is covered by the stack layers 203, 205, 207 and 213. Accordingly, a process of removing the impurity injection mask after forming the second impurity injection area 201b and a cleaning process may be omitted, and a phenomenon that the cell gates CG fall down or become slant may be minimized.

Figure 2F:
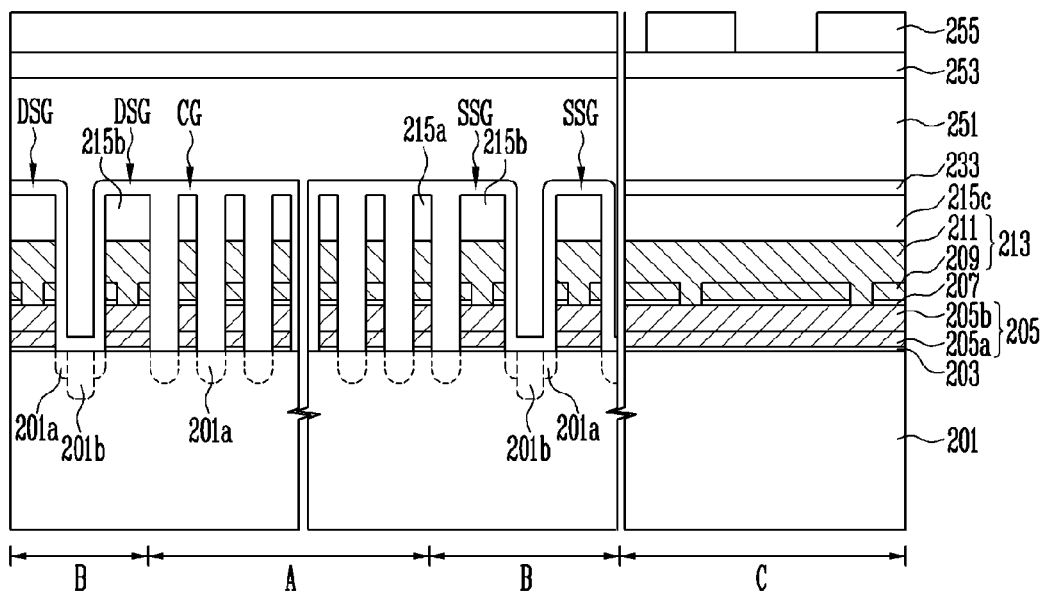

In FIG. 2F, the semiconductor substrate 201 between the select gates DSG and SSG may be exposed by etching some of the spacer layer 233 through an etch back or a blanking etching process after the second impurity injection area 201b is formed. Here, the spacer layer 233 remains at sides of the select gates DSG and SSG and may protect the select gates DSG and SSG during following process of forming a contact hole between the select gates DSG and SSG.

Subsequently, the auxiliary layer 251 is formed with adequate thickness so that is filled a space between the select gates DSG or SSG is filled with a material such as spin on carbon SOC for the purpose of planarization. Then, a protection layer 253 is formed on the auxiliary layer 251, and third etching mask patterns 255 are formed on the protection layer 253.

It is desirable that the auxiliary layer 251 is formed of material different from the stack layers 203, 205, 207 and 213 so that a whole surface of the semiconductor substrate 201 has an even surface and functions as an etching mask when following process of patterning driving gates is performed. The auxiliary layer 251 may be an SOC layer as mentioned above. The protection layer 253 is formed to prevent exposure of the auxiliary layer 251 in case that a possibility that the auxiliary layer 251 is removed during a process of removing third etching mask patterns 255 exits, and may be formed of an SiON. The third etching mask patterns 255 defines an area in which the driving gates are formed, cover whole surface of the semiconductor substrate 201 in the first and the second areas A and B, and expose a portion of the protection layer 253 or the auxiliary layer 251 in the third area C. In addition, the third etching mask patterns 255 may be formed by using a photolithography process, and be photoresist material.

Figure 2G:
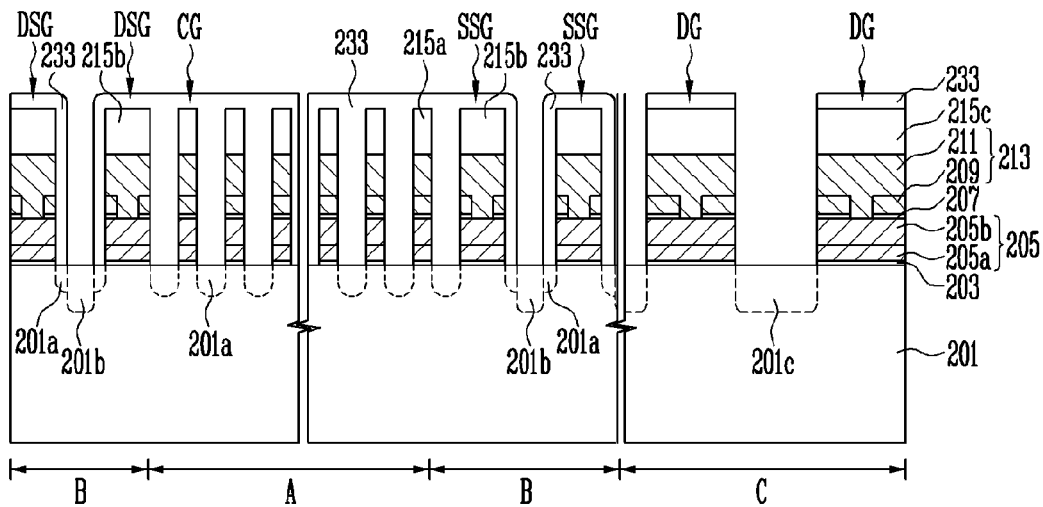

In FIG. 2G, the protection layer 253 exposed through the third etching mask patterns 255 is removed, and the auxiliary layer 251 exposed through an area in which the protection layer 253 is removed is removed. Then, the third etching mask patterns 255 may be removed. Subsequently, the spacer layer 233 exposed through an area in which the auxiliary layer 251 is removed is removed. In addition, the first hard mask pattern 215c exposing an area in which the spacer layer 233 is removed is removed. Then, driving gates DG are formed in the third area C of the semiconductor substrate 201 by etching the stacking structure 203, 205, 207 and 213 for the gate pattern exposed through an area in which the first hard mask pattern 215c is removed. The driving gates DG corresponds to, for example, gates of a driver transistor for driving a memory device. Spaces between the driving gates DG are wider than those between the cell gates CG. The driving gate DG is formed with an aspect ratio smaller than the cell gate CG.

A third impurity injection area 201c is formed in the semiconductor substrate 201 at both sides of the driving gates DG. The third impurity injection area 201c is formed by using a counter doping process and an impurity injection process for forming a source area and a drain area for the driver. Then, the protection layer and the auxiliary layer may be removed. Here, since the spacer layer 233 is formed between the cell gates CG through precedent process, shape of the cell gate CG may not be deformed due to the spacer layer 233 but be maintained though the aspect ratio of the cell gate CG is high and the space between the cell gates CG is narrow. Subsequently, following process such as a process of forming an insulating layer between the select gates DSG and SSG and the driving gates DG, etc. may be performed, which is not shown.

In case that the protection layer and the auxiliary layer are not formed, the third etching mask pattern may be removed after the third impurity injection area 201c is formed by using the third etching mask pattern as an impurity injection mask for forming the third impurity injection area 201c.

In an embodiment of the present invention, the process of forming the impurity injection mask for forming the impurity areas 201c in the third areas C under the condition that the insulating layer such as the spacer layer 233 is formed between the cell gates CG, the process of removing the impurity injection mask and following cleaning process are performed. Accordingly, the shape of the cell gate CG may not be deformed due to the spacer layer 233 during the process of removing the impurity injection mask and the following cleaning process.

In an embodiment, the driving gates DG are patterned separately from the cell gates CG and the select gates DSG and SSG, and thus damage of the semiconductor substrate 201 occurred due to difference of etching speed, when patterns having large widths and/or intervals and patterns having small widths and/or intervals are simultaneously patterned, may be improved. Here, the distance between the driving gates DG is wider than that between the cell gates CG and the select gates DSG and SSG. The etching speed of an area in which patterns having large widths and/or intervals is generally faster than that of an area in which patterns having small widths and/or intervals, and thus the semiconductor substrate 201 may be damaged at the area in which the patterns having large widths and/or intervals.

In an embodiment, since the second and the third impurity areas 201b and 201c are formed separately from the first impurity area 201a, a process of tuning electrical conditions of the impurity areas using extra impurity injection process to satisfy electrical characteristics required for respective impurity areas may be omitted.

Although embodiments have been described with reference to a number of illustrative embodiments thereof, it should be understood that numerous other modifications and embodiments can be devised by those skilled in the art that will fall within the spirit and scope of the principles of this disclosure.

What is claimed is:

1. A method of fabricating a semiconductor device, the method comprising:
   forming a stack layers on a semiconductor substrate having a first area and a second area;
   forming first gates on the semiconductor substrate of the first area by patterning the stack layers, wherein the first gates are formed a first distance apart from each other;
   forming a first impurity injection area in the semiconductor substrate of the first area exposed at both sides of each of the first gates, wherein the stack layers cover the semiconductor substrate of the second area so that the first impurity injection area is not formed in the second area;
   filling a space between the first gates with an insulating layer;
   forming second gates on the semiconductor substrate of the second area by patterning the stack layers, wherein the second gates are formed a second distance apart from each other, and wherein the second distance is larger than the first distance; and
   forming a second impurity injection area in the semiconductor device of the second area exposed between the second gates.

2. The method of claim 1, wherein the step of forming the first gates includes:
   forming a first hard mask layer on the stack layers;
   forming first hard mask patterns covering the stack layers of the second area and defining an area in which the first gates are formed by patterning the first hard mask layer; and
   removing the stack layers exposed through the first hard mask patterns.

3. The method of claim 2, wherein the step of forming the first hard mask patterns includes:
   forming a second hard mask layer on the first hard mask layer;
   forming partition patterns on the second hard mask layer of the first area;
   forming spacers on sidewalls of the partition patterns;
   removing the partition patterns;
   forming second hard mask patterns on the first hard mask layer of the first area by removing the second hard mask layer exposed through the spacers;
   forming photoresist patterns covering the first hard mask layer of the second area and exposing the first hard mask layer and the second hard mask patterns of the first area;
   removing the first hard mask layer of the first area exposed through the photoresist patterns and the second hard mask patterns; and
   removing the photoresist patterns and the second hard mask patterns.

4. The method of claim 2, wherein the step of forming the second gates includes:
   forming photoresist patterns over an entire structure including the first gates, the first hard mask patterns and the insulating layer to cover the first gates and the insulating layer and define an area in which the second gates are formed;
   removing a part of the first hard mask patterns exposed through the photoresist patterns;
   removing a part of the stack layers exposed through an area in which the part of the first hard mask pattern is removed; and
   removing the photoresist patterns.

5. The method of claim 1, wherein the step of forming the second impurity injection area includes:
   forming an impurity injection mask to expose the semiconductor substrate between the second gates;
   injecting impurities into the semiconductor substrate between the second gates exposed through the impurity injection mask; and
   removing the impurity injection mask.

6. The method of claim 1, wherein an aspect ratio of the first gate is higher than that of the second gate.

7. A method of fabricating a semiconductor device, the method comprising:
   forming stack layers on a semiconductor substrate having a cell area, a select transistor area and a peripheral area;
   forming cell gates on the semiconductor substrate of the cell area by patterning the stack layers of the cell area;
   forming a first impurity injection area in the semiconductor substrate of the cell area exposed at both sides of the cell gate;
   filling a space between the cell gates with an insulating layer;
   forming select gates on the semiconductor substrate of the select transistor area and driving gates on the semiconductor substrate of the peripheral area by patterning the stack layers of the select transistor area and the peripheral area, wherein the select gates and the driving gates are formed after filling the space between the cell gates with the insulating layer;
   forming a second impurity injection area in the semiconductor substrate of the select transistor area exposed between the select gates; and
   forming a third impurity injection area in the semiconductor substrate of the peripheral area exposed at both sides of the driving gate.

8. The method of claim 7, wherein the step of forming the cell gates includes;
   forming a first hard mask layer on the stack layers;
   forming first hard mask patterns covering the stack layers of the select transistor area and the peripheral area and defining an area in which the cell gates are formed by patterning the first hard mask layer; and removing the stack layers exposed through the first hard mask patterns.

9. The method of claim 8, wherein the step of forming the first hard mask patterns includes:
forming a second hard mask layer on the first hard mask layer;
forming partition patterns on the second hard mask layer of the cell area;
forming spacers on sidewalls of partition patterns;
removing the partition patterns;
forming second hard mask patterns in the cell area by removing the second hard mask layer exposed through the spacers;
forming photoresist patterns covering the first hard mask layer of the select transistor area and the peripheral area and exposing the first hard mask layer and the second hard mask patterns of the cell area;
removing the first hard mask layer of the cell area exposed through the photoresist patterns and the second hard mask patterns; and
removing the photoresist patterns and the second hard mask patterns.

10. The method of claim 8, wherein the step of forming the select gates and the driving gates includes:
forming photoresist patterns over an entire structure including the cell gates, the first hard mask patterns and the insulating layer to cover the cell gates and the insulating layer and define areas in which the select gates and the driving gates are formed;
removing a part of the first hard mask patterns exposed through the photoresist patterns;
removing a part of the stack layers exposed through an area in which the part of the first hard mask patterns is removed; and
removing the photoresist patterns.

11. The method of claim 7, wherein the step of forming the second impurity injection area includes:
forming an impurity injection mask exposing the semiconductor substrate between the select gates;
injecting impurities into the semiconductor substrate between the select gates exposed through the impurity injection mask; and
removing the impurity injection mask.

12. The method of claim 7, wherein an aspect ratio of the cell gate is higher than that of the select gate and the driving gate.

13. The method of claim 7, wherein a space between the cell gates is narrower than that of the select gates and that of the driving gates.

14. The method of claim 7, wherein the stack layers includes:
a gate insulating layer formed on the semiconductor substrate;
a floating gate layer formed on the gate insulating layer;
a dielectric layer formed on the floating gate layer and having a contact hole for exposing the floating gate layer in the select transistor area and the peripheral area; and
a control gate layer formed on the dielectric layer.

15. A method of fabricating a semiconductor device, the method comprising:
forming stack layers on a semiconductor substrate having a cell area, a select transistor area and a peripheral area;
forming cell gates and select gates spaced by patterning the stack layers of the cell area and the select transistor area, wherein a distance between the select gates is larger than a distance between the cell gates, and wherein the cell gates are formed on the semiconductor substrate of the cell area and the select gates are formed on the semiconductor substrate of the select transistor area;
forming a first impurity injection area in the semiconductor substrate of the cell area exposed at both sides of respective cell gates and in the semiconductor substrate of the select transistor area exposed between the select gates;
forming a spacer layer along an entire structure including the first impurity injection to fill a space between the cell gates with the spacer layer and to expose a center portion of a space between the select gates;
forming a second impurity injection area in the semiconductor substrate of the select transistor area between the select gates;
forming driving gates on the semiconductor substrate of the peripheral area by patterning the stack layers, wherein the driving gates are formed after forming the second impurity injection area; and
forming a third impurity injection area in the semiconductor substrate of the peripheral area exposed at both sides of the driving gate.

16. The method of claim 15, wherein the step of forming the cell gates and the select gates includes:
forming a first hard mask layer on the stack layers;
forming first hard mask patterns covering the stack layers of the peripheral area and defining areas in which the cell gates and the select gates are formed by patterning the first hard mask layer; and
removing the stack layers exposed through the first hard mask patterns.

17. The method of claim 16, wherein the step of forming the first hard mask patterns includes:
forming a second hard mask layer on the first hard mask layer;
forming partition patterns on the second hard mask layer of the cell area;
forming spacers on sidewalls of partition patterns;
removing the partition patterns;
forming second hard mask patterns by removing the second hard mask layer exposed through the spacers;
forming photoresist patterns covering the first hard mask layer of the peripheral area, exposing the first hard mask layer and the second hard mask patterns in the cell area and exposing a part of the first hard mask layer in the select transistor area;
removing the first hard mask layer of the cell area and the select transistor area exposed through the photoresist patterns and the second hard mask patterns; and
removing the photoresist patterns and the second hard mask patterns.

18. The method of claim 16, wherein the step of forming the driving gates includes:
forming photoresist patterns over an entire structure including the spacer layer, the first and second impurity injection area, and first hard mask patterns to define an area in which the driving gates are formed and to cover the select transistor area and the cell area;
removing a part of the first hard mask patterns exposed through the photoresist patterns;
removing a part of the stack layers exposed through an area in which the part of the first hard mask pattern is removed; and
removing the photoresist patterns.

19. The method of claim 18, further comprising:
forming an auxiliary layer having an even surface to fill a space between the select gates;
forming a protection layer on the auxiliary layer;

removing the protection layer exposed through the photoresist patterns; and removing the auxiliary layer exposed through an area in which the protection layer is removed, wherein the steps of forming the auxiliary layer and forming the protection layer are performed before the step of forming the photoresist patterns, and the steps of removing the protection layer and the auxiliary layer are performed after the photoresist patterns are removed.

20. The method of claim 19, further comprising:

removing the protection layer and the auxiliary layer after forming the third impurity injection area by using the remaining protection layer and the auxiliary layer as an impurity injection mask.

21. The method of claim 15, wherein an aspect ratio of the cell gate is higher than that of the select gate and the driving gate.

22. The method of claim 15, wherein the stack layers includes:

a gate insulating layer formed on the semiconductor substrate;

a floating gate layer formed on the gate insulating layer;

a dielectric layer formed on the floating gate layer and having a contact hole for exposing the floating gate layer in the select transistor area and the peripheral area; and a control gate layer formed on the dielectric layer.

* * * * *